United States Patent [19]
Risch et al.

[11] Patent Number: 5,736,761
[45] Date of Patent: Apr. 7, 1998

[54] DRAM CELL ARRANGEMENT AND METHOD FOR ITS MANUFACTURE

[75] Inventors: Lothar Risch, Neubiberg; Franz Hofmann; Wolfgang Roesner, both of Munich; Wolfgang Krautschneider, Hohenthann, all of Germany

[73] Assignee: Siemens Aktiengesellschaft, Germany

[21] Appl. No.: 645,503

[22] Filed: May 14, 1996

[30] Foreign Application Priority Data

May 24, 1995 [DE] Germany ............... 195 19 159.5

[51] Int. Cl.$^6$ .................. H01L 27/108; H01L 29/76; H01L 29/94; H01L 31/119
[52] U.S. Cl. ............................. 257/301; 257/305
[58] Field of Search ........................ 257/301, 305

[56] References Cited

U.S. PATENT DOCUMENTS 4,630,088  12/1986  Ogura et al. .
4,974,060  11/1990  Ogasawara .
5,376,575  12/1994  Kim et al. .

FOREIGN PATENT DOCUMENTS 38 44 120 A1  7/1989  Germany .
44 10 352 A1  11/1995  Germany .
WO 93/12542  6/1993  WIPO .

OTHER PUBLICATIONS

Patent Abstracts of Japan, vol. 17, No. 401 (E–1404), 27 Jul. 1993, & JP-A-05 075059 (Mitsubishi Electric Corp.), 26 Mar. 1993.

Patent Abstracts of Japan, vol. 14, No. 156, (E–908), 26 Mar. 1990, & JP-A-02 014563 (Matsushita Electron Corp.), 18 Jan. 1990.

International Electron Devices Meeting, 1991, vol. 17, No. 2.1.8, 11 Dec. 1991, A Surrounding Isolation–Merged Plate electrode (Simple) Cell with checkered layout for 256M bit DRAM and beyond, T. Ozaki et al, pp. 469–472.

Patent Abstracts of Japan, vol. 16, No. 59, (E–1166), 14 Feb. 1992, & JP-A-03 256358, (Hitachi Ltd.), 15 Nov. 1991.

IEDM 85, A Deep–Trenched Capacitor Technology for 4 Mega Bit Dynamic RAM, K. Yamada, et al, pp. 702–705.

1990 Symposium on VLSI Technology, Bit–Line Shielded Memory Cell Technology for 64Mb DRAMs, Y. Kawamoto et al, pp. 13–14.

*Primary Examiner*—Stephen Meier
*Attorney, Agent, or Firm*—Hill, Steadman & Simpson

[57] ABSTRACT

The DRAM cell arrangement has one vertical MOS transistor per memory cell, whose first source/drain region adjoins a trenched bitline (5), whose gate electrode (13) is connected with a trenched wordline and whose second source/drain region (3) adjoins a substrate main surface (1). A capacitor dielectric (16), which is in particular a ferroelectric or paraelectric layer, is arranged on at least the second source/drain region and a capacitor plate (17) is arranged on the dielectric, so that the second source/drain region (3) acts additionally as a memory node. The DRAM cell arrangement can be manufactured with a memory cell surface of 4 $F^2$.

13 Claims, 4 Drawing Sheets

DRAM CELL ARRANGEMENT AND METHOD FOR ITS MANUFACTURE

BACKGROUND OF THE INVENTION

In DRAM cell arrangements, that is, memory cell arrangements with dynamic, random access, so-called one-transistor memory cells are used almost exclusively. A one-transistor memory cell has a read-out transistor and a memory capacitor. In the memory capacitor, the information is stored in the form of an electric charge that represents a logical quantity, zero or one. Through driving of the read-out transistor via a wordline, this information can be read out via a bitline.

Since the storage density increases from storage generation to storage generation, the surface needed for the one-transistor memory cell must be reduced from generation to generation. Since limits are set on the reduction of the sizes of the structures by the minimum structure size F that can be manufactured in the respective technology, this is also connected with a change in the one-transistor memory cell. Thus, up to the 1 Mbit generation, both the read-out transistor and the memory capacitor are implemented as planar components. Starting with the 4 Mbit generation, a further surface reduction by means of a three-dimensional arrangement of read-out transistors and memory capacitors must take place. One possibility is to implement the memory capacitor in a trench (see for example, Yamada, K. et al., "A deep trenched capacitor technology for 4 Mbit DRAMs", Proc. Intern. Electronic Devices and Materials IEDM 85, p. 702).

It has also been proposed to construct the memory capacitor as a stacked capacitor (see for example Kawamoto, Y. et al., "A 1.28 µm² Shielded Memory Cell Technology for 64 Mbit DRAMs," Techn. Digest of VLSI Symposium, 1990, p. 13). A structure made of polysilicon, for example, a crown structure or a cylinder, which is contacted with the surface, is formed via the wordlines. This polysilicon structure forms the memory node. It is provided with a capacitor dielectric and capacitor plate. This design has the advantage that it is to a large extent compatible with a logic process.

The surface for a memory cell of a DRAM in the 1 Gbit generation should be only 0.2 µm². The memory capacitor must thereby have a capacitance of 20 to 30 fF. In a cell surface such as is available in the 1 Gbit generation, a capacitance of this sort can be implemented in a stacked capacitor only with a relatively complicated structure of the polysilicon structure. In addition, these complicated structures are increasingly difficult to manufacture due to their topology.

It has also been proposed to increase the capacitance achievable per surface through the use of a dielectric with a high dielectric constant. As a dielectric with a high dielectric constant, paraelectrics and ferroelectrics are particularly suitable (see for example, International reference WO 93/12542).

SUMMARY OF THE INVENTION

It is an object of the present invention to provide a DRAM cell arrangement that has one-transistor memory cells as memory cells and that can be manufactured with a packing density required for the 1 Gbit generation. In addition, a manufacturing method for such a DRAM cell arrangement is provided.

In general terms the present invention is a DRAM cell arrangement having memory cells that respectively comprise a read-out transistor and a memory capacitor. The read-out transistors are formed as vertical MOS transistors integrated in a semiconductor substrate, of which one source/drain region respectively adjoins a main surface of the semiconductor substrate, and of which the other source/drain region respectively adjoins a bitline trenched in the semiconductor substrate, and of which the gate electrode is connected with a wordline which is trenched in the semiconductor substrate and which crosses the bitlines. The memory capacitors are respectively constructed from one of the source/drain regions adjoining the main surface as a memory node, from a capacitor dielectric arranged above it, and from a capacitor plate.

Advantageous developments of the present invention are as follows.

The semiconductor substrate is doped at least in the area of the DRAM cell arrangement with a first conductivity type. The semiconductor substrate has pillars arranged in rows and columns, which pillars adjoin a main surface of the semiconductor substrate.

Each pillar has a region doped with a second conductivity type opposed to the first, and a region doped with the first conductivity type. The region doped with the second conductivity type respectively adjoins the main surface and, in the area of the main surface, the edges of the respective pillar. The region doped with the first conductivity type is arranged underneath the region doped with the second conductivity type, adjoins the edges of the pillar and is connected with the area of the semiconductor substrate doped with the first conductivity type. The trenched bitlines run essentially parallel and are respectively arranged between adjoining rows of the pillars. The trenched wordlines run essentially parallel, cross the bitlines and are respectively arranged between adjacent columns of the pillars. A gate oxide and one of the gate electrodes (13) are respectively provided along at least one edge of the pillars, and partially cover the respective edge, so that the MOS transistor vertical to the main surface is formed. The gate electrodes to pillars arranged along one of the columns are respectively electrically connected with one of the wordlines. The capacitor dielectric is arranged above the pillars. The continuous capacitor plate is arranged above the capacitor dielectric. The region doped with the second conductivity type in the pillars respectively operates simultaneously as memory node and as source/drain region of one of the vertical MOS transistors. Insulation structures are provided by which the wordlines and the gate electrodes are insulated from the bitlines, the silicon pillars and the capacitor plate.

The capacitor dielectric is formed from a material having a relative dielectric constant $\epsilon_r$ between 100 and 1000.

The capacitor dielectric is formed as a whole-surface layer.

The insulating structures only partially fill the area between adjoining silicon pillars, so that in the area of the main surface, the edges of the silicon pillars are partially covered with capacitor dielectric.

The width of the bitlines and of the wordlines, as well as the distance between adjoining bitlines and between adjoining wordlines, is respectively essentially equal. The gate oxide of the vertical MOS transistors respectively covers two edges of a pillar respectively, the two edges adjoining one another.

The semiconductor substrate has monocrystalline silicon at least in the area of the DRAM cell arrangement. The insulating structures are formed of $SiO_2$. The bitlines are formed as doped regions in the semiconductor substrate. The gate electrodes and the wordlines comprise doped polysilicon.

In general terms the present invention is also a method for manufacturing a DRAM cell arrangement, in which memory cells having respectively one read-out transistor and one memory capacitor are produced. Trenched bitlines and trenched wordlines are produced in a semiconductor substrate. The read-out transistors are formed as vertical MOS transistors in the semiconductor substrate, of which one source/drain region respectively adjoins a main surface of the semiconductor substrate and of which the other source/drain region respectively adjoins one of the trenched bitlines, and whose gate electrode is connected with one of the trenched wordlines.

A capacitor dielectric and a capacitor plate are deposited for the formation of the memory capacitors above the source/drain regions adjoining the main surface, so that the source/drain region adjoining the main surface simultaneously acts as memory node.

Advantageous developments of the present invention are as follows.

The capacitor dielectric is formed from a material having a relative dielectric constant $\epsilon_r$ between 100 and 1000.

The capacitor dielectric is formed as a continuous layer.

In a semiconductor substrate doped with a first conductivity type in at least one area for the DRAM cell arrangement, a region doped with a second conductivity type opposed to the first is produced, which adjoins a main surface of the semiconductor substrate.

First trenches running essentially parallel are produced in the semiconductor substrate.

Bitlines are produced at the base of the first trenches. The first trenches are filled with a first insulating structure. Second trenches are produced that cross the first trenches and that extend at least to the surface of the bitline, whereby pillars made of semiconductor material arise, which are arranged respectively between two adjoining first trenches and two adjoining second trenches. The second trenches are filled with a second insulating structure whose height is less than the depth of the second trenches. An anisotropic etching is carried out, which selectively attacks the first insulating structure and the second insulating structure to the pillars of semiconductor material. During which the etching holes are etched that extend from the main surface up to the height of the bitlines and in which respectively at least one edge of the pillars, which adjoins one of the second trenches, is partially uncovered. Gate oxides are produced at the uncovered edges of the pillars. Gate electrodes that respectively fill the holes are produced in the holes. Wordlines are produced in the second trenches that are respectively electrically connected with gate electrodes arranged along the respective second trenches. A third insulating structure is produced in the second trenches. A capacitor dielectric is produced that covers at least the surface of the pillars in the area of the main surface. A capacitor plate is produced that covers at least the pillars.

The first insulating structures and the third insulating structures are formed so that they terminate in height with the pillars. The first insulating structures and the third insulating structures are selectively etched back to the pillars, whereby steps arise at the edges of the pillars, which steps are covered by the capacitor dielectric.

The first trenches and the second trenches are essentially formed in the same width, whereby the distance between adjoining trenches is essentially equal to the width of the trenches. The holes are etched using a mask with essentially square mask openings, whereby the side length of the square mask openings is essentially equal to the width of the trenches. The midpoints of the square mask openings are arranged so as to be displaced with respect to the centers of the first trenches, as well as of the second trenches, by less than the width of the trenches.

A semiconductor substrate, a substrate is used that has monocrystalline silicon at least in the area of the DRAM cell arrangement. The insulating structures are formed from $SiO_2$. The bitlines and the region doped with the second conductivity type are formed through implantation. The wordlines and the gate electrodes are formed from doped polysilicon.

In the inventive DRAM cell arrangement, one-transistor memory cells are provided, in which the read-out transistor is formed as a vertical MOS transistor. One of the source/drain regions of the vertical MOS transistor adjoins a main surface of a semiconductor substrate, in which the DRAM cell arrangement is implemented. The other source/drain region adjoins a trenched bitline. On the main surface, a capacitor dielectric is arranged on the surface of the source/drain region adjacent thereto, and a cell plate is arranged above it. In addition, the source/drain region adjoining the main surface function as a memory node for the memory capacitor formed from the capacitor plate, capacitor dielectric and source/drain region.

The channel region of the MOS transistor is arranged in the semiconductor substrate and is provided with a gate dielectric and with a gate electrode. The gate electrode is connected with a wordline. Gate electrodes and wordlines are trenched in the substrate and insulated from the source/drain regions, the bitlines and the channel regions by insulating structures.

The DRAM cell arrangement is preferably implemented in a semiconductor substrate that has monocrystalline silicon at least in the area for the DRAM cell arrangement. This may be a wafer made entirely of monocrystalline silicon, or an SOI substrate, having, on a silicon wafer, an insulating layer and a thin monocrystalline silicon layer on this insulating layer.

Preferably, the capacitor dielectric is formed from a material having a relative dielectric constant $\epsilon_r$ between 100 and 1000.

The inventive DRAM cell arrangement may be manufactured with a planar surface or with a surface having a flat topology, so that a ferroelectric or paraelectric layer can be used as a capacitor dielectric. Ferroelectric and paraelectric layers have a high relative dielectric constant $\epsilon_r$, in the range of 500 to 1000. If these layers are deposited by sputtering, they can be used only on flat surfaces or on surfaces with a flat topology. Even in CVD or sol-gel processes having better edge coverage, no complicated 3D structures can be manufactured due to the required thickness of the layers. Barium-strontium titanate, lead-zircon titanate or strontium titanate are preferably used as a capacitor dielectric. Also, the materials known from International reference WO 93/12542 are suited for use as a capacitor dielectric. With these dielectrics with high relative dielectric constants, the required capacitance in 20 to 30 fF can be achieved even on a surface of about 0.2 to 0.4 µm².

Preferably, the semiconductor substrate has pillars of semiconductor material arranged in rows and columns. The vertical MOS transistors are then implemented along at least one edge of these pillars so that the gate dielectric and the gate electrode only partially cover the edge of the respective pillar, parallel to the main surface of the semiconductor substrate. The vertical MOS transistors can be manufactured particularly advantageously if they respectively partially cover two adjacent edges of the pillars.

According to an embodiment, the bitlines respectively run between adjoining rows of pillars. The wordlines, which are respectively connected with gate electrodes, run between adjoining columns of pillars. An insulating structure is provided between the wordlines and the bitlines. In addition, the wordlines are insulated against the active transistor regions.

The pillars are preferably produced through two etching steps. Thereby first trenches are etched at first, running essentially parallel. In the second etching step, second trenches are etched, which cross the first trenches and likewise run essentially parallel. If the first trenches and the second trenches are dimensioned so that the width of each trench is equal to the distance between adjoining trenches, and if this width if chosen to correspond to the smallest manufacturable structure size F in the respective technology, then the surface for a memory cell is 4 $F^2$. That is, in a 0.18 µm technology each memory cell requires a surface of 0.13 µm$^2$.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

In a main surface 1 of a substrate 2, made of for example, monocrystalline silicon, which at least in the area for a DRAM cell arrangement is p-doped with a doping material concentration of for example, $5 \times 10^{17}$ cm$^{-3}$, an n$^+$-doped region 3 is produced over the entire surface. The n+-doped region 3 is for example formed through ion implantation. It has a doping material concentration of for example, $1 \times 10^{20}$ cm$^{-3}$. The depth of the n$^+$-doped region amounts for example to 0.5 µm.

Using a trench mask made of, for example, SiO$_2$ and light-sensitive lacquer (not shown), first trenches 4 are etched in the main surface 1. The first trenches 4 run essentially parallel. They comprise a depth of for example, 0.8 µm. The width of the first trenches 4 is for example, F=180 nm, and the distance between adjoining trenches 4 is for example, F=180 nm. The first trenches 4 extend parallel to the main surface 1 over the entire cell field and have a length of for example, 100 µm. The depth of the first trenches 4 must be at least high enough that the first trenches 4 reach through the n$^+$-doped region 3 (see FIG. 1).

Figure 1:
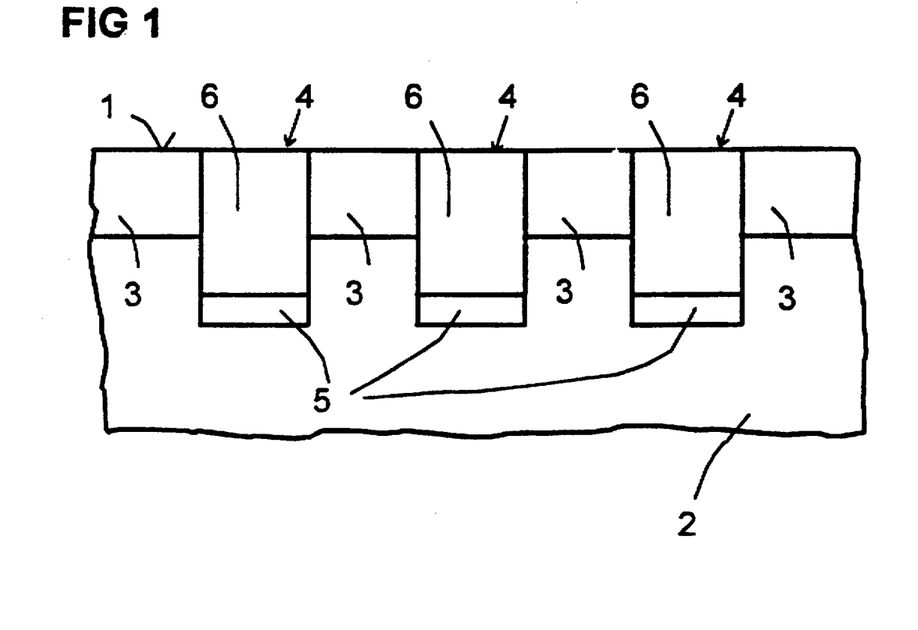
FIG. 1 shows a section through a substrate after the formation of first trenches and bitlines.

N$^+$-doped bitlines 5 are formed at the base of the first trenches 4 by ion implantation. The bitlines 5 have a doping material concentration of for example, at least $\geq 10^{\circ}$cm$^{-3}$ and a depth of for example, 0.2 µm.

The first trenches 4 are subsequently filled with a first insulating structure 6 made of for example, SiO$_2$. The first insulating structure 6 is formed for example, through the conformal depositing of an SiO$_2$ layer and subsequent planarization.

Subsequently, second trenches 7 are etched using a second trench mask, which second trenches cross the first trenches essentially at a right angle. The second trenches 7 are etched at the same depth as the first trenches 4. It is important that the surface of the bitlines in the second trenches 7 is uncovered. Subsequently the second trenches 7 are filled with second insulating structures 8. The second insulating structures 8 extend in approximately up to the height of the n$^+$-doped regions 3. The second insulating structures 8 are formed for example, from SiO$_2$ through the conformal depositing of an SiO$_2$ layer and subsequent etching back (see FIG. 2, in which a section perpendicular to the section shown in FIG. 1, parallel to a bitline 5, shows between two adjoining bitlines 5).

Figure 2:
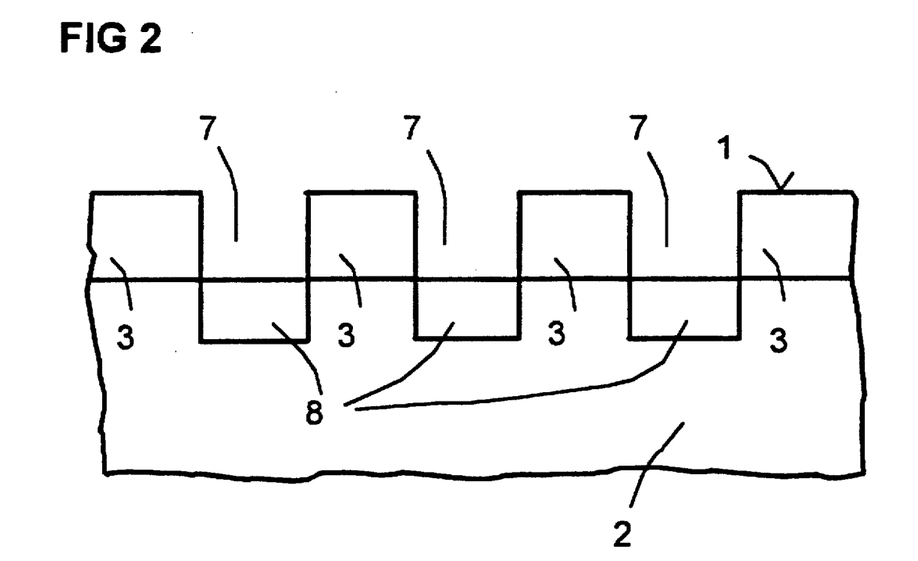
FIG. 2 shows a section parallel to the course of the bitlines through the substrate after the formation of second trenches.

Each two pairs of adjoining first trenches 4, as well as second trenches 7, define a pillar made of silicon, having, in the area of the main surface 1, the n$^+$-doped region 3, and, under this, substrate material 2, which is p-doped.

A mask 9 made for example, of SiO$_2$ is produced, having masking openings 10. The masking openings 10 have an essentially square cross-section parallel to the main surface 1, and are arranged in the form of a grid. By means of the masking openings 10, the arrangement of vertical MOS transistors is defined. The masking openings 10 are arranged so that they respectively overlap a corner of one of the pillars. The square cross-section of the masking openings 10 has a side length that is equal to the width of the first trenches 4 as well as of the second trenches 7. The center of the masking openings 10 is respectively arranged so as to be displaced by half a side length in relation to the centers of the adjoining first trenches 4 and second trenches 7. The widths and spacings of the trenches 4, 7 respectively have a minimum manufacturable structure size F, and the side length of the masking openings 10 likewise has a minimum manufacturable structure size F. The center of the masking openings 10 is respectively displaced by ½ F in relation to the centers of the trenches 4, 7. Here the fact that the precision of adjustment is finer than the smallest manufacturable structural size is exploited. In a 1 Gbit technology, the smallest manufacturable structural size F is equal to 180 nm, and an adjustment is possible with a precision of about ⅓ F.

Figure 3:
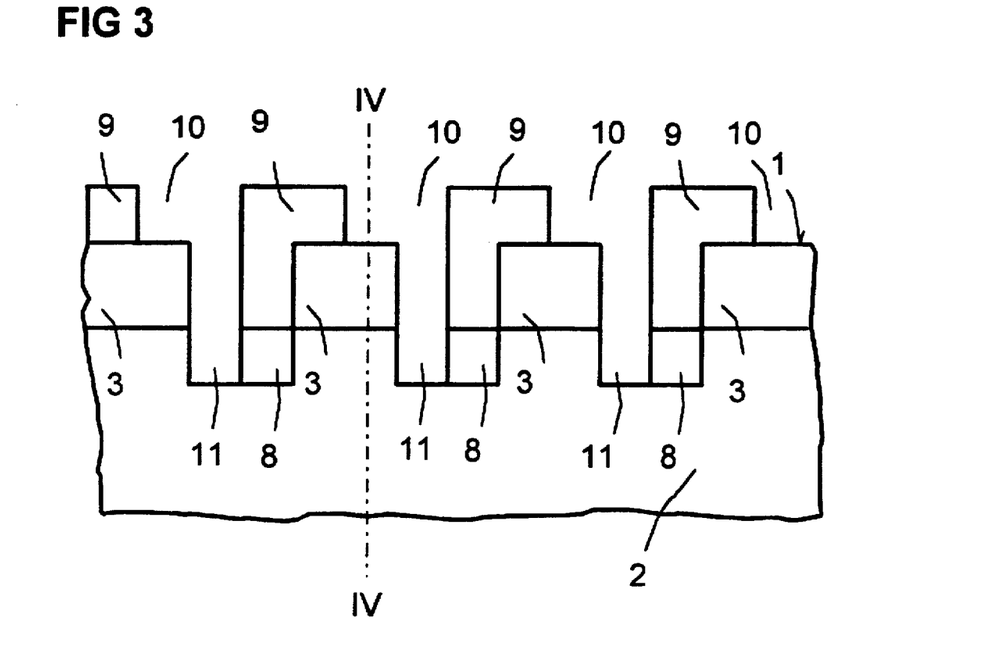
FIG. 3 shows a section parallel to a bitline between adjoining bitlines through the substrate after the etching of openings for vertical MOS transistors.
Figure 4:
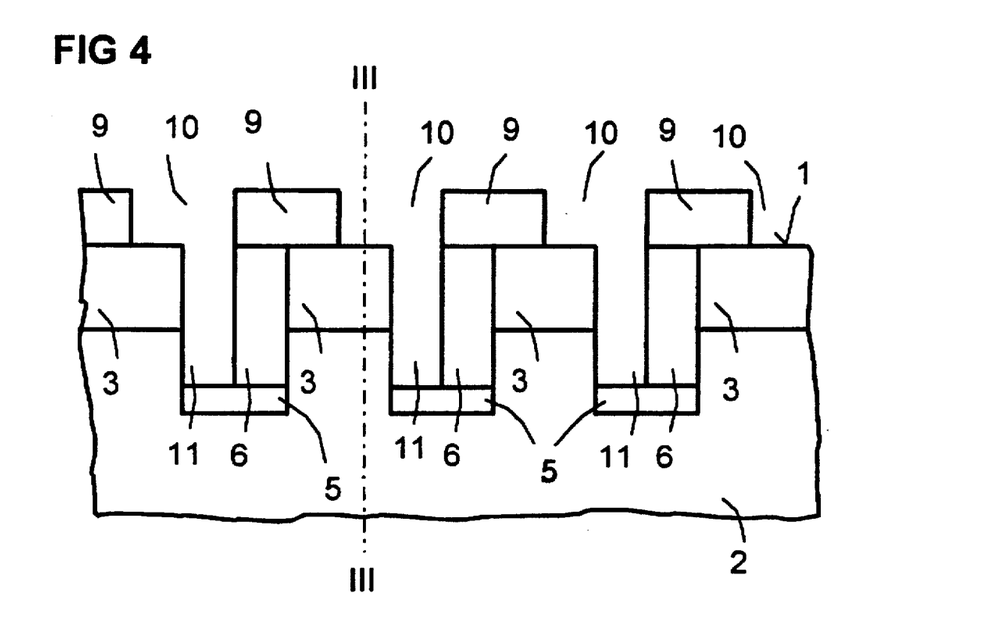
FIG. 4 shows a section perpendicular to the bitlines through the substrate after the opening of the holes for the formation of the vertical MOS transistors.

In an anisotropic etching process that attacks SiO$_2$ selectively to silicon, for example, with reactive ion etching, holes 11 are etched that extend from the main surface 1 to the height of the bitlines 5 (see FIG. 3 and FIG. 4). The holes 11 has a hooked cross-section, whereby the hook can be made up of three small squares. The missing fourth small square arises through the pillar made of silicon, which is not attacked in the anisotropic etching process. The edges of the pillar are uncovered in the hole 11.

After removal of the mask 9, for the formation of a gate oxide 12 a thermal oxidation is carried out at for example, 800° C. $SiO_2$ is thereby formed at all uncovered silicon surfaces. Gate electrodes 13 and wordlines 14 are subsequently produced from doped polysilicon. For this purpose, by means of in situ doped depositing a polysilicon layer is for example produced that is as thick as the holes 11 and as wide as the second trenches 7 above the second insulating structure 8. Subsequently, the doped polysilicon layer is etched back, for example, through reactive ion etching, until the height of the wordline 14 under the main surface 1 is reached. The dimensioning of the wordlines 14 is set by means of the etching duration. The structuring of the wordlines 14 ensues in a self-adjusting manner.

Through depositing and etching back of a further $SiO_2$ layer, third insulating structures 15 are formed above the wordlines. The height of the third insulating structures 15 is less than the main surface 1, so that steps respectively appear at the edges of the $n^+$-doped region 3 of the pillars (see FIG. 5 and FIG. 6). The height of these steps is for example, 0.2 to 0.5 µm.

Figure 5:
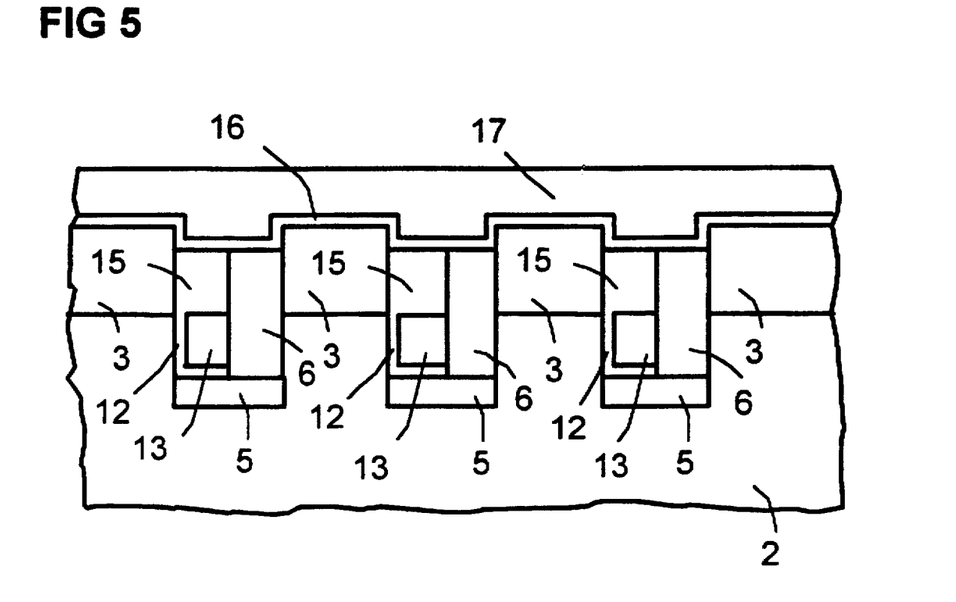
FIG. 5 shows a section perpendicular to the bitlines through the substrate after the formation of the gate oxide, gate electrode, capacitor dielectric and capacitor plate.
Figure 6:
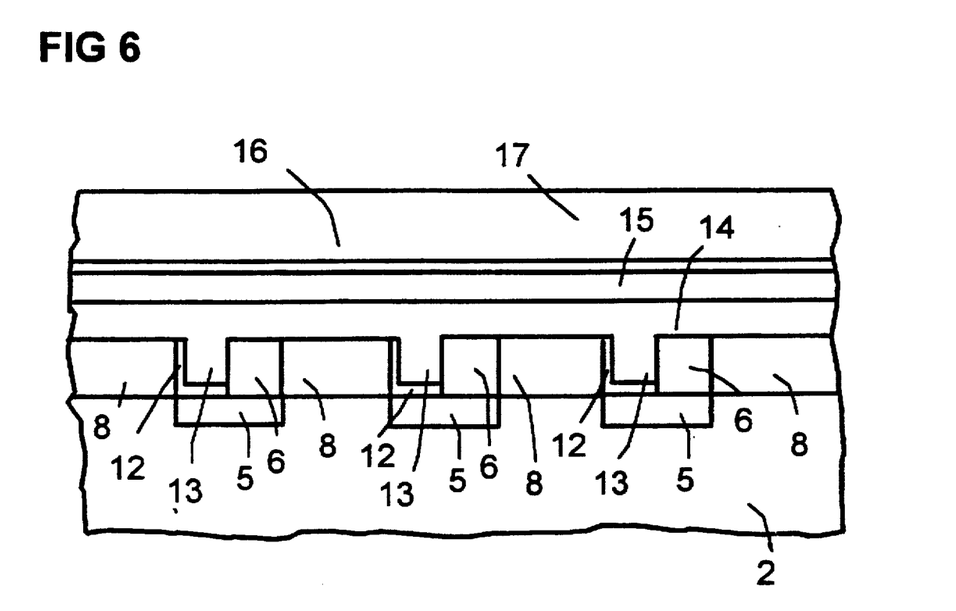
FIG. 6 shows a section perpendicular to the bitlines, parallel to the wordlines through a wordline on the substrate after the formation of the gate oxide, gate electrode, wordlines, capacitor dielectric and capacitor plate.

Subsequently, a capacitor dielectric 16 is deposited. The capacitor dielectric has a thickness of for example, 50 nm. For this purpose, a continuous ferroelectric or paraelectric layer having a relative dielectric constant $\epsilon_r$ in the range between 500 and 1000 is for example deposited through sputtering, CVD depositing or in a sol-gel process. Preferably, the capacitor dielectric has at least one of the materials barium-strontium titanate, strontium titanate or lead zircon titanate. The capacitor dielectric 16 is arranged in the area of the $n_+$-doped regions on the silicon surface that was uncovered in the etching back of the third insulating structures 15. In cases in which there is a danger of a reaction between the material of the capacitor dielectric 16 and the silicon, or of a diffusion of the material of the capacitor dielectric 16 into the silicon, or of some other affect on the silicon by the material of the capacitor dielectric 16, at least the uncovered surface of the $n_+$-doped region 3 is covered with an intermediate layer, made for example, of TiN, $RuO_2$, Pt or W.

If the material of the capacitor dielectric 16 comprises leakage currents on a scale that is not acceptable for a memory capacitor, the capacitor dielectric 16 is structured. The capacitor dielectric 16 is thereby respectively interrupted above the third insulating structure 15 or, respectively, the first insulating structure 6.

A continuous capacitor plate 17, made of for example, polySi, TiN, Pt, W, or $RuO_2$ is deposited on the capacitor dielectric 16. The capacitor plate 17 covers at least the area of the first and second trenches.

Figure 7:
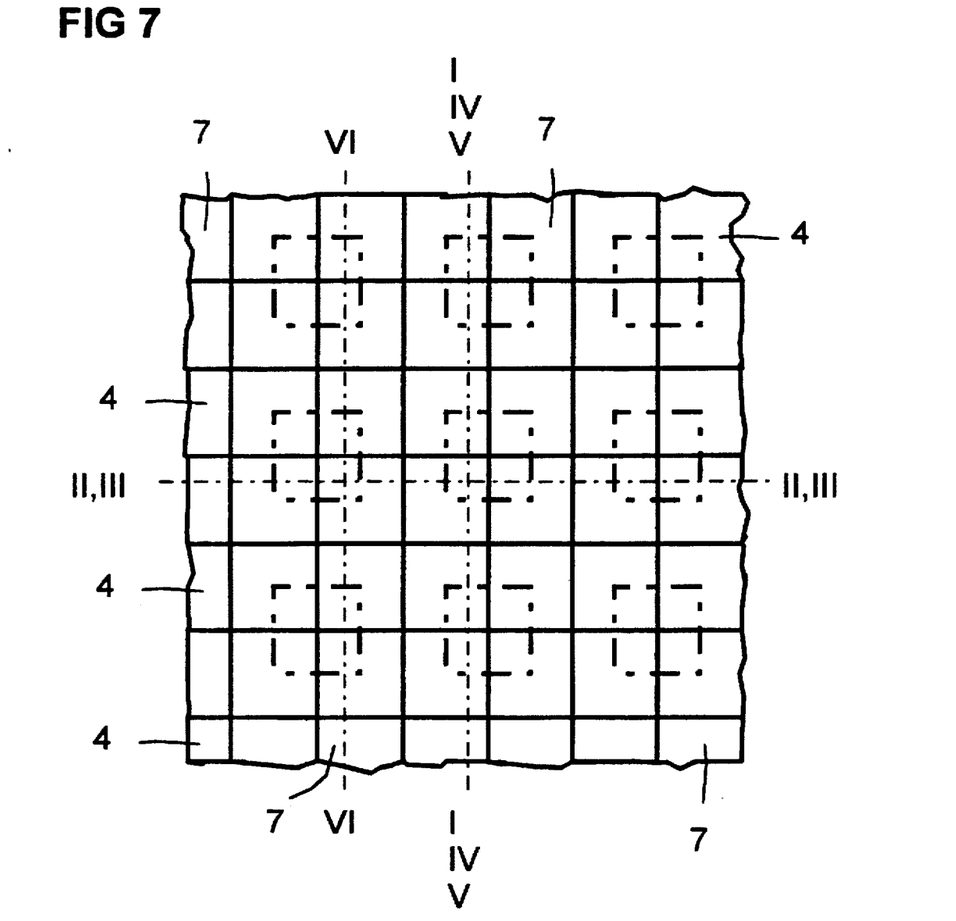
FIG. 7 shows a schematic view of a substrate with the first trenches and the second trenches and the masking openings for the formation of the holes for the vertical MOS transistors.

FIG. 7 shows a schematic view of the substrate 2 with the first trenches 4 and the second trenches 7. Furthermore, in FIG. 7 the position of the masking openings 10 is indicated by outlining in broken lines. For better comprehensibility, the sections shown in FIGS. 1, 2, 3, 4, 5 and 6 are shown by means of broken lines with the designations I, II, III, IV, V and VI.

Since the first trenches 4 run parallel and has equal width and equal spacing, for example, a minimum structure size F=180 nm, and the second trenches 7 also have equal width and spacing, for example, a minimum structure size F=180 nm, the space requirement per memory cell (2×trench width)$^2$ is for example, 4 $F^2$=0.13 µm$^2$.

Apart from the possible structuring of the capacitor dielectric, the manufacturing of the inventive DRAM cell arrangement requires three masks, which are to be adjusted.

The two masks used for etching the first trenches 4 as well as the second trenches 7 are not critical as regards their adjustment. Only mask 9, with which the holes 11 are etched, must be precisely adjusted.

When using a material for the capacitor dielectric 16 that has a sufficiently high relative dielectric constant $\epsilon_r$, the third insulating structure 15 can be so formed that it terminates at the height of the main surface 1. In the inventive DRAM cell arrangement, the $n_+$-doped region 3, bitline 5 and the substrate 2 lying between them respectively form a vertical MOS transistor with the gate oxide 12 and the gate electrode 13. The $n_+$-doped region 3, the capacitor dielectric 16 and the capacitor plate 17 form the memory capacitor. The $n_+$-doped region 3 is simultaneously used as the source/drain region of the vertical MOS transistor and as the memory node of the memory capacitor. Additional space is thereby gained. In addition, the source/drain regions of the vertical MOS transistor and the memory nodes of the memory capacitor are manufactured so as to be electrically connected with one another, so that the critical contact hole etching, required in the prior art for the connection of the polysilicon structure with the substrate in stacked capacitors, is no longer needed.

The invention is not limited to the particular details of the method and apparatus depicted and other modifications and applications are contemplated. Certain other changes may be made in the above described method and apparatus without departing from the true spirit and scope of the invention herein involved. It is intended, therefore, that the subject matter in the above depiction shall be interpreted as illustrative and not in a limiting sense.

What is claimed is:

1. A DRAM cell arrangement, comprising:
a plurality of memory cells, each memory cell of the plurality of memory cells having a read-out transistor and a memory capacitor;
said read-out transistors being formed as vertical MOS transistors integrated in a semiconductor substrate, a respective read-out transistor having a first source/drain region respectively adjoining a main surface of the semiconductor substrate, a second source/drain region respectively adjoining a respective bitline trenched in the semiconductor substrate, and a gate electrode connected to a wordline which is trenched in the semiconductor substrate and which crosses the bitlines; and
said memory capacitors being respectively constructed from said first source/drain regions adjoining the main surface as memory nodes, from a capacitor dielectric arranged above said first source/drain regions, and from a capacitor plate arranged above said dielectric.

2. The DRAM cell arrangement according to claim 1:
wherein the semiconductor substrate is doped at least in an area of the DRAM cell arrangement with a first conductivity type;
wherein the semiconductor substrate has pillars arranged in rows and columns, said pillars adjoining the main surface of the semiconductor substrate;
wherein each pillar has a region doped with a second conductivity type opposed to the first conductivity type, and a region doped with the first conductivity type, the region doped with the second conductivity type respectively adjoining the main surface and in the area of the main surface adjoining edges of the respective pillar, and the region doped with the first conductivity type being arranged underneath the region doped with the second conductivity type, adjoining the edges of the respective pillar and being connected with the area of the semiconductor substrate doped with the first conductivity type;

wherein the trenched bitlines run substantially parallel to each other and are respectively arranged between adjoining rows of the pillars;

wherein the trenched wordlines run substantially parallel to each other, cross the bitlines and are respectively arranged between adjacent columns of the pillars;

wherein a gate oxide and one of the gate electrodes are respectively provided along at least one edge of the pillars, and partially cover said at least one edge, so that the MOS transistor vertical to the main surface is formed;

wherein the gate electrodes at the pillars arranged along one of the columns being respectively electrically connected with one of the wordlines;

wherein the capacitor dielectric is arranged above the pillars;

wherein the capacitor plate is continuous and is arranged above the capacitor dielectric;

wherein the region doped with the second conductivity type in the pillars respectively operates simultaneously as memory node and as source/drain region of one of the vertical MOS transistors; and wherein insulation structures are provided by which the wordlines and the gate electrodes are insulated from the bitlines, the silicon pillars and the capacitor plate.

3. The DRAM cell arrangement according to claim 2, wherein the insulating structures only partially fill an area between adjoining silicon pillars, so that in an area of the main surface, edges of the silicon pillars are partially covered with capacitor dielectric.

4. The DRAM cell arrangement according to claim 1, wherein the capacitor dielectric is formed as a whole-surface layer.

5. The DRAM cell arrangement according to claim 1, wherein the capacitor dielectric is formed from a material having a relative dielectric constant between 100 and 1000.

6. The DRAM cell arrangement according to claim 1, wherein widths of the bitlines and of the wordlines are substantially equal and distances between adjoining bitlines and between adjoining wordlines are substantially equal; and wherein the gate oxide of the vertical MOS transistors respectively covers two edges of a pillar, said two edges adjoining one another.

7. The DRAM cell arrangement according to claim 1:

wherein the semiconductor substrate has monocrystalline silicon at least in the area of the DRAM cell arrangement;

wherein the insulating structures have $SiO_2$;

wherein the bitlines are formed as doped regions in the semiconductor substrate; and wherein the gate electrodes and the wordlines have doped polysilicon.

8. A DRAM cell arrangement, comprising:

a plurality of memory cells, each memory cell of the plurality of memory cells having a read-out transistor and a memory capacitor;

said read-out transistors being formed as vertical MOS transistors integrated in a semiconductor substrate, a respective read-out transistor having a first source/drain region respectively adjoining a main surface of the semiconductor substrate, a second source/drain region respectively adjoining a respective bitline trenched in the semiconductor substrate, and a gate electrode being connected to a wordline which is trenched in the semiconductor substrate and which crosses the bitlines;

said memory capacitors being respectively constructed from said first source/drain regions adjoining the main surface as memory nodes, from a capacitor dielectric arranged above said first source/drain regions, and from a capacitor plate arranged above said dielectric;

the semiconductor substrate being doped at least in an area of the DRAM cell arrangement with a first conductivity type;

the semiconductor substrate having pillars arranged in rows and columns, said pillars adjoining the main surface of the semiconductor substrate;

each pillar having a region doped with a second conductivity type opposed to the first conductivity type, and a region doped with the first conductivity type, the region doped with the second conductivity type respectively adjoining the main surface and in the area of the main surface adjoining edges of the respective pillar, and the region doped with the first conductivity type being arranged underneath the region doped with the second conductivity type, adjoining the edges of the respective pillar and being connected with the area of the semiconductor substrate doped with the first conductivity type;

the trenched bitlines running substantially parallel to each other and being respectively arranged between adjoining rows of the pillars;

the trenched wordlines running substantially parallel to each other, crossing the bitlines and being respectively arranged between adjacent columns of the pillars;

a gate oxide and one of the gate electrodes being respectively provided along at least one edge of the pillars, and partially covering said at least one edge, so that the MOS transistor vertical to the main surface is formed;

the gate electrodes at the pillars arranged along one of the columns being respectively electrically connected with one of the wordlines;

the capacitor dielectric being arranged above the pillars;

the capacitor plate being continuous and arranged above the capacitor dielectric;

the region doped with the second conductivity type in the pillars functioning as a memory node and as a source/drain region of one of the vertical MOS transistors; and insulation structures by which the wordlines and the gate electrodes are insulated from the bitlines, the silicon pillars and the capacitor plate.

9. The DRAM cell arrangement according to claim 8, wherein the capacitor dielectric is formed from a material having a relative dielectric constant between 100 and 1000.

10. The DRAM cell arrangement according to claim 8, wherein the capacitor dielectric is formed as a whole-surface layer.

11. The DRAM cell arrangement according to claim 8, wherein the insulating structures only partially fill an area between adjoining silicon pillars, so that in an area of the main surface, edges of the silicon pillars are partially covered with capacitor dielectric.

12. The DRAM Cell arrangement according to claim 8, wherein widths of the bitlines and of the wordlines are substantially equal and distances between adjoining bitlines and between adjoining wordlines, are substantially equal; and wherein the gate oxide of the vertical MOS transistors respectively covers two edges of a pillar, said two edges adjoining one another.

13. The DRAM cell arrangement according to claim 8,
wherein the semiconductor substrate has monocrystalline silicon at least in the area of the DRAM cell arrangement;

wherein the insulating structures have $SiO_2$;

wherein the bitlines are formed as doped regions in the semiconductor substrate; and wherein the gate electrodes and the wordlines have doped polysilicon.

* * * * *